United States Patent [19]
Watanabe et al.

[11] Patent Number: 6,012,894
[45] Date of Patent: Jan. 11, 2000

[54] AUTOMATIC LOT ORGANIZATION METHOD

[75] Inventors: Hiroshi Watanabe; Hiroaki Hasegawa, both of Itami, Japan

[73] Assignee: Mitsubishi Denki Kabushiki Kaisha, Tokyo, Japan

[21] Appl. No.: 08/655,378

[22] Filed: May 30, 1996

Related U.S. Application Data

[62] Division of application No. 08/267,360, Jul. 29, 1994, Pat. No. 5,551,830.

[30] Foreign Application Priority Data

Jun. 30, 1993 [JP] Japan .................... 5-162832

[51] Int. Cl.⁷ ............... B65G 1/00; B65G 49/07
[52] U.S. Cl. .......... 414/806; 414/807; 414/940; 414/273
[58] Field of Search .................. 414/786, 267, 414/331, 332, 935, 273, 940, 806, 807

[56] References Cited

U.S. PATENT DOCUMENTS

| | | |
|---|---|---|
| 4,719,694 | 1/1988 | Herberich et al. ............ 214/273 |
| 4,833,306 | 5/1989 | Milbrett . |
| 4,867,629 | 9/1989 | Iwasawa et al. . |
| 4,936,734 | 6/1990 | Osada . |
| 4,947,784 | 8/1990 | Nishi . |
| 4,955,775 | 9/1990 | Ohkase et al. . |
| 5,024,570 | 6/1991 | Kiriseko et al. . |
| 5,059,079 | 10/1991 | Foulke et al. . |
| 5,163,802 | 11/1992 | Poinelli . |
| 5,284,412 | 2/1994 | Shiraiwa et al. . |

FOREIGN PATENT DOCUMENTS

| | | |
|---|---|---|
| 3716549 | 5/1987 | Germany . |
| 3909669 | 5/1989 | Germany . |
| 4128374 | 1/1991 | Germany . |
| 4121429 | 6/1991 | Germany . |
| 4127341 | 8/1991 | Germany . |
| 4203074 | 2/1992 | Germany . |
| 62-112339 | 5/1987 | Japan . |
| 441311 | 2/1992 | Japan . |
| 547896 | 2/1993 | Japan . |
| 89/03586 | 4/1989 | WIPO . |

*Primary Examiner*—Karen M. Young
*Assistant Examiner*—Raymond B. Johnson
*Attorney, Agent, or Firm*—Leydig, Voit & Mayer, Ltd.

[57] ABSTRACT

An apparatus for automatically organizing a variable number of lots into a batch which can be treated with high efficiency in a semiconductor wafer manufacturing line is installed for changing the number of lots organized into a batch between preceding and succeeding processes when such change is required. The apparatus includes a stocker array including a plurality of stockers disposed in a linear array and each capable of accommodating therein a plurality of lots, a first transfer robot disposed at one side of the stocker array for placing and taking out the lots in and from the stockers, a second transfer robot disposed at other side of the stocker array above for placing and taking out the lots in and from the stockers at a rear side thereof, a station for disposing thereon a plurality of lots handled by the first and second robots, a lot identifying device for reading identification information of the lots disposed on the station, a third transfer robot for transferring the lots disposed on the station with the first and second transfer robots, and a control unit for controlling automatically the stockers, the station and the first, second and third transfer robots in an coordinated manner to thereby allow the lots disposed on the station to be accommodated at predetermined positions in the stocker array in accordance with the lot identification information, to thereby organize the lots into a group in accordance with lot organization conditions such as conditions under which the lots are to be treated, distribution of load in the manufacturing line, and priorities allocated to the processes.

6 Claims, 10 Drawing Sheets

AUTOMATIC LOT ORGANIZATION METHOD

This application is a division of patent application Ser. No. 08/267,360, filed Jun. 29, 1994 issued Sep. 3, 1996 (U.S. Pat. No. 5,551,830).

BACKGROUND OF THE INVENTION

1. Field of the Invention

The present invention generally relates to an article manufacturing line which includes a series of treating or processing steps or stages (also referred to as the processes) and which incorporates at least one batch process where treating is simultaneously preformed on a plurality of lots collected in a batch (i.e., on a batch-by-batch basis). In particular, the present invention is concerned with an automatic lot organization method and apparatus for carrying out automatic organization and/or reorganization of lots in batches for batch processing or treating. In particular, the invention concerns a semiconductor device manufacturing line which includes an automatic lot organization (or regrouping) apparatus as well as a method of automatically organizing or regrouping lots which are to undergo identical treatment on a batch basis in a succeeding process or processes.

2. Description of the Related Art

For better understanding of the invention, the technical background thereof will be described in some detail by reference to FIG. 11 which is a schematic diagram showing a known semiconductor wafer manufacturing line in which lot organization or regrouping is performed between a lot-based process where semiconductor wafers are treated on a lot-by-lot basis and a batch process where a plurality of lots are simultaneously treated on a batch-by-batch basis. In the figure, reference characters A, B, C and D designate individual lots, wherein lots designated by a same reference character are those which are to undergo treatment on the same conditions in the batch process, while numerals indicate the order or sequence in which the lots A, B, C and D have been transferred to a process where a predetermined number of the semiconductor wafers are to undergo the same treatment, simultaneously.

Now, description will be made of a lot organization method adopted heretofore in a semiconductor wafer manufacturing line. Referring to FIG. 11, the lots A to D arrived at the current process in the order indicated by the numerals 1 to 10 are once stored in predetermined places to wait for lot organization on a batch basis and loading in a treatment process (such as, for example, a pre-treatment for wetting the semiconductor wafer before a diffusion process, such as a thermal diffusion process, an etching process, a photolithography process or the like) with priorities of loading allocated to the semiconductor wafers being altered, as occasions require. Heretofore, this lot storing/regrouping process has been carried out manually by workers, and the lots are classified into groups or sets in accordance with the conditions for the treatments which the lots are to undergo (such as, for example, types of the treatments such as diffusion, etc., temperatures of the treatments, temporal durations or periods required for the treatments, types of gases used in the treatment and others). Thus, the process includes a so-called lot organization process.

Referring again to FIG. 11, it is assumed that tenth and eleventh lots A10 and B11 are transported manually from a preceding process in which treating was individually conducted on the lots (i.e., on a lot-by-lot basis) to the current process where treating is to be simultaneously performed for a predetermined number of lots (i.e., on a batch-by-batch basis). These lots A10 and B11 are stored at relevant locations in a stocker facility where the lots destined for identical treatment under identical conditions have already been stocked. In this manner, the lots are organized into groups or sets each including a predetermined number of lots of the same type. It is assumed in the case of the illustrated example that one set includes four lots. Thereafter, the four lots A organized or grouped into one set and allocated with a higher priority are first treated in the current process to be subsequently transferred to a succeeding process where treatment is performed simultaneously for the four lots or individually for each of the lots. Next, the batch including the four lots B is loaded in the treating of another type and then transferred to the succeeding process, which is then followed by treating of the lots C and so fourth, the treatings being conducted in accordance with the priorities imparted to the lots.

In conjunction with automation of such type lot organization as mentioned above, there is disclosed in a Japanese Unexamined Patent Application No. 112339/1987 (JP-A-62-112339) a lot organization apparatus for organizing semiconductor substrates used in semiconductor device manufacturing processes into groups or sets each housed in a wafer cassette. However, this apparatus is inherently designed for use in a wafer-by-wafer process for trial manufacture or a small-scale manufacture of large varieties of semiconductor substrates.

The hitherto known semiconductor wafer manufacturing scheme illustrated in FIG. 11 in which the lot organization process is manually carried out by relying on the judgement of worker(s) suffers a serious problem that artificial errors can not be avoided incurring, consequently, a false or erroneous lot organization as well as misplacement of the lots in the loading sequence, which results in the unwanted situation in which some lots are left in the stocked state over an extended period without being loaded in the process. Further, the known lot organization scheme can not easily and rapidly cope with modifications or alterations in the number of the conditions for the treatings as well as changes of environmental conditions of the relevant production lines. More specifically, in the case of the known manufacturing process, the optimal conditions for treating have been determined by repeating such trial-and-error procedure that upon occurrence of unsatisfactory product as a result of treating under certain conditions, the latter are then replaced by other conditions. Thus, a large amount of time is required for establishing the optimal conditions for the treatment and hence for the lot organization. Besides, when one of the optimal conditions has to be altered, then the procedure for determining the optimal conditions as a whole has to be repeated from the beginning with the optimal conditions once established previously being discarded. Apparently, the workers will encounter great difficulty in determining the optimal conditions by taking into account the priorities of the treatment which the wafers are to undergo as well as the conditions for the treatment.

The lot organization apparatus disclosed in the publication JP-A-62-112339 cited above is certainly effective so long as a number of lots treated through a series of processes remains constant. However, this known apparatus is not suited for manufacturing a variety of devices by changing throughput such as in the case where the number of lots has to be changed between the preceding and succeeding processes (such as encountered in, for example, the diffusion process in manufacturing the semiconductor device). In other words, the diffusion process (e.g. oxidation process, LPCVD (Low Pressure Chemical Vapor Deposition) process and others) which requires a high relative process ratio (i.e., ratio of the time required for a particular process to a total time taken for the manufacturing) incurs a remarkable time consumption inclusive of the time for rising up the temperature of wafer and cooling thereof (e.g. ten hours or more). Thus, in order to enhance the manufacturing efficiency, it is desirable to treat the semiconductor wafers on a batch basis by collecting or organizing the lots to be subjected to a same treatment in a same set or group. However, in many cases, the number of lots grouped or organized into a set will change in dependence on the types or conditions of treatments, which can not satisfactorily be coped with by the apparatus described in the above-mentioned publication.

SUMMARY OF THE INVENTION

In the light of the state of the art described above, it is an object of the present invention to provide a lot organization method and apparatus which can successfully solve the aforementioned problems.

Another object of the present invention is to provide a lot organization method and apparatus which can effectively cope with changes in the number of lots treated through a series of processes while preventing the lots from being left in the stocked state over an extended period.

Yet another object of the invention is to provide a lot organization method and apparatus which can positively exclude errors not only in the lot organization but also in the lot loading order or sequence.

A further object of the present invention is to provide a lot organization method and apparatus of the type mentioned above which can profitably find application in a semiconductor device manufacturing line.

In view of the above and other objects which will become apparent as the description proceeds, the present invention in its broadest sense is directed to a system for manufacturing an article through a series of sequential processes, wherein at least two successive processes differ from each other in respect to a number of lots which can be treated on a batch basis in the two processes. In the system mentioned above, there is provided according to a general aspect of the invention an apparatus interposed between the two processes for automatically organizing the lots upon transferring thereof from a preceding one of the processes to the succeeding process, which apparatus comprises a deposit station for receiving lots transferred from the preceding process and storing temporarily the lots as received, a lot identifying device provided in association with the deposit station for identifying the lots transferred from the preceding process, a stocker array including a plurality of compartments for storing the lots received from the deposit station for the purpose of lot organization, a transfer robot disposed movably between the deposit station and the stocker array for transferring reciprocatively the lots between the deposit station and the stocker array, and a control unit for receiving lot identification information from the lot identifying device to control at least one of the stocker array and the transfer robot on the basis of the lot identification information such that those of the lots stored in the compartments which are decided to undergo a same treating on a batch-by-batch basis in the succeeding process are organized into a set.

In a preferred mode for realizing the apparatus described above, the plurality of compartments of the stocker array may be disposed in a linear array and have respective access ports opened at both sides of the linear array, wherein position information of the compartments are previously stored in the control unit, wherein at least first and second transfer robots are installed, respectively, at both sides of the linear array to be movable between the deposit station means and the stocker along the linear array under the control of the control unit on the basis of the lot identification information, the compartment position information and condition information for the treating which the lots are to undergo in such a manner that those of the lots disposed on the deposit station which are decided to undergo a same treatment in the succeeding process on a batch-by-batch basis are once placed in a same compartment of the stocker array and taken out from the same compartment to be transferred to the succeeding process as a set of lots to be treated on a batch-by-batch basis in the succeeding process.

In another preferred mode for carrying out the invention, a third transfer robot may be provided for receiving the lots delivered from the preceding process to dispose the lots on the deposit station at a position where lot identification information of the lots can be read out by the lot identifying device, wherein the third transfer robot may additionally be used for transferring the lots between the deposit station and the first transfer robot as well as between the second transfer robot and the deposit station under the control of the control unit.

In yet another preferred mode for carrying out the invention, the first transfer robot may be so controlled by the control unit on the basis of the compartment position information for placing arbitrarily selected ones of the lots transferred from the deposit station in arbitrarily selected ones of the compartments, while the second robot is controlled by the control unit on the basis of the lot identification information, the compartment position information and the treating condition information in such a manner that those of the lots placed in the compartments which are decided to undergo a same treating in the succeeding process on a batch-by-batch basis are taken out from the compartments of the stocker to be organized into a set of lots which can be treated on a batch basis in the succeeding process.

Each of the compartments mentioned above may include a plurality of shelves movable along a closed loop to be exposed to the access ports for allowing the first and second robots to make access to the lots placed on the shelves.

According to another aspect of the invention, there is further provided an automatic lot organization apparatus incorporated in a semiconductor device manufacturing line, which apparatus comprises a stocker array including a plurality of stockers disposed in a linear array and each capable of accommodating therein a plurality of lots, a first transfer robot disposed at one side of the stocker array for placing and taking out the lots in and from the stockers, a second transfer robot disposed at other side of the stocker array for placing and taking out the lots in and from the stockers at a rear side thereof, a deposit station for disposing thereon a plurality of lots handled by the first and second robot, a lot identifying device for reading identification information of the lots disposed on the deposit station, a third transfer robot for transferring the lots disposed on the deposit station with the first and second transfer robot, respectively, and a control unit for controlling automatically the stocker array, the station and the first, second and third transfer robots in an a coordinated manner to thereby allow the lots disposed on the station to be accommodated at predetermined positions in the stocker array in accordance with the lot identification information, to thereby organize the lots into a group in accordance with lot organization conditions such as conditions under which the lots are to be treated, distribution of load in the manufacturing line, and priorities allocated to the processes.

With the structures of the automatic lot organization apparatus described above, the lots can automatically be organized into sets which are to undergo identical treatment in succeeding processes, respectively, in accordance with lot identification information by taking into account the conditions for the treatment in the succeeding processes, distribution of loads in the manufacturing lines, priorities of the treatments and other information stored in the control unit, whereby the efficiency of the manufacturing line can significantly be increased while preventing stagnation from occurring in the line.

According to yet another aspect of the invention, an article manufacturing line is provided which includes a plurality of processes for treating a plurality of lots en bloc on a batch-by-batch basis, a lot organization method of automatically organizing the lots, which method comprises the step of organizing automatically lots in a batch in accordance with conditions such as treating conditions in a succeeding process, state of load prevailing in the manufacturing line, priorities assigned to the treatments and others.

In a preferred mode for carrying out the method described above, the lots which are to undergo treating under identical conditions are stored in a set or group on a predetermined shelf of a predetermined one of the stockers.

In another preferred mode for carrying out the method, the lots which are to undergo identical treatment are taken out from the stocker(s) and grouped or organized into a set to be transferred to a succeeding process.

The above and other objects, features and attendant advantages of the present invention will more easily be understood by reading the following description of the preferred embodiments thereof taken, only by way of example, in conjunction with the drawings.

DESCRIPTION OF THE PREFERRED EMBODIMENTS

Now, the present invention will be described in detail in conjunction with the preferred or exemplary embodiments thereof by reference to the drawings.

Embodiment 1

Figure 1:
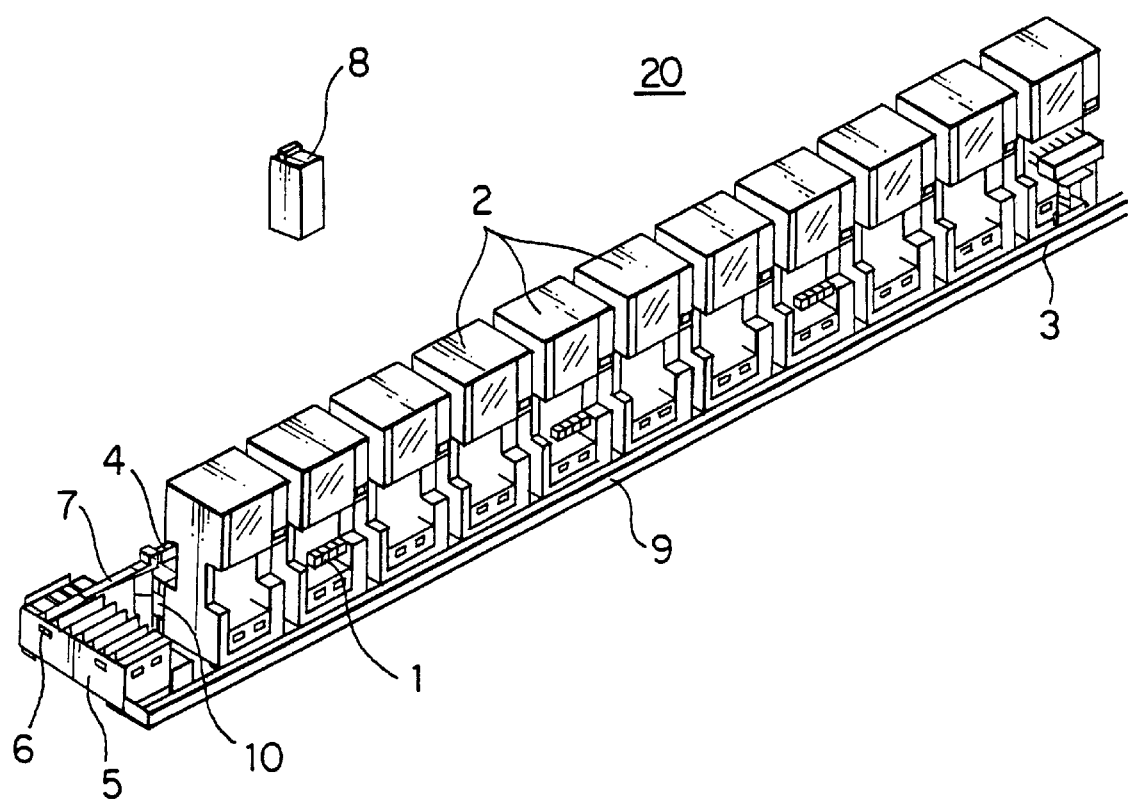
FIG. 1 is a perspective view showing generally an automatic lot organization apparatus according to a first exemplary embodiment of the present invention.
Figure 2:
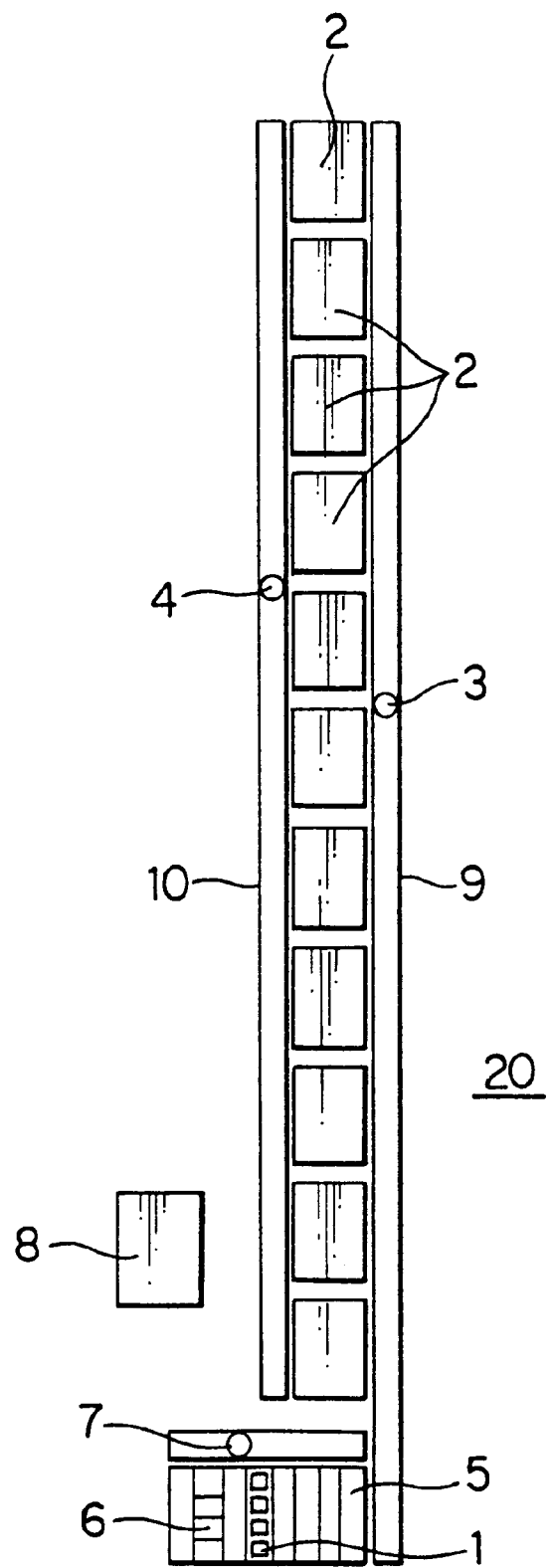
FIG. 2 is a schematic top plan view showing the same.
Figure 3:
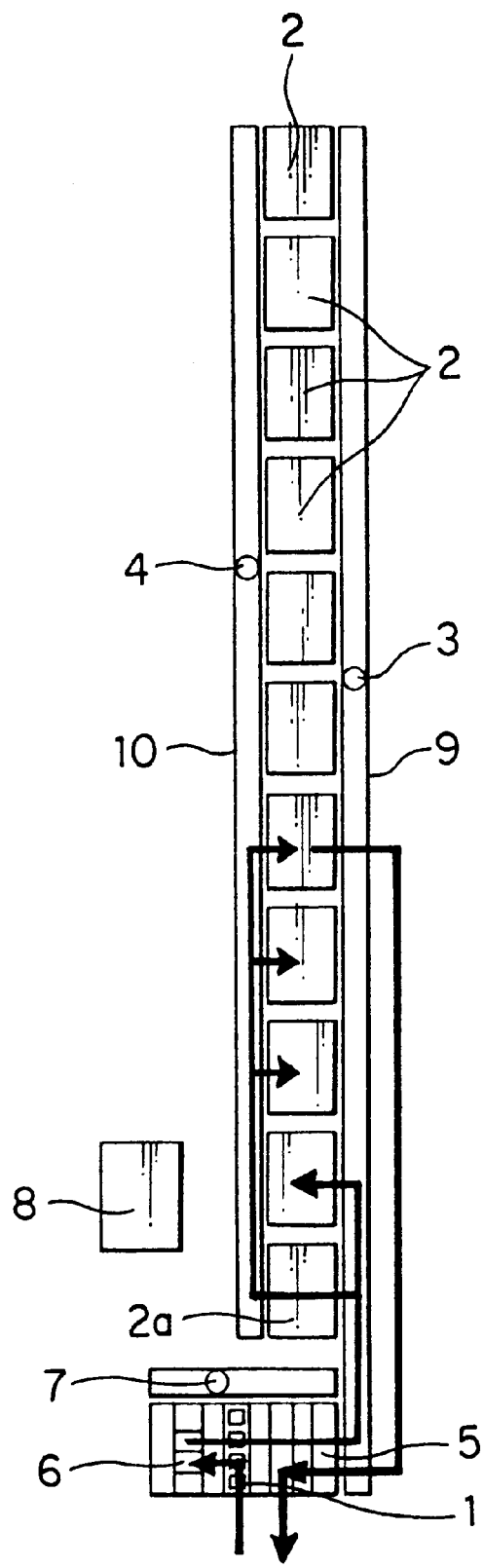
FIG. 3 is a view similar to FIG. 2 for illustrating generally operation of the automatic lot organization apparatus.

FIG. 1 is a perspective view showing generally an automatic lot organization apparatus according to a first embodiment of the invention, FIG. 2 is a top plan view showing schematically the same, and FIG. 3 is a view similar to FIG. 2 for illustrating operation of the apparatus.

Referring to FIG. 1, the automatic lot organization apparatus according to the instant embodiment of the invention is comprised of a plurality of stockers 2 juxtaposed in a linear array (referred to as a stocker array) hereinafter, wherein each stocker defining a compartment serves for storing a plurality of lots 1. A first transfer robot 3 is installed at a front side of the stocker array 20 for placing in and taking out the lots 1 from the individual stockers 2. A second transfer robot 4 is installed at a rear side of the stocker array 20 for handling the lots 1 in a same manner as the first transfer robot 3. A deposit station 5 is provided for placing thereon a plurality of lots 1 handled by the first and second transfer robots 3 and 4. Provided in association with the station 5 is a lot identifying device 6 for reading lot identifying information of the lots 1 disposed on the station 5. Further, a third transfer robot 7 is provided for aiding the transfer of the lots 1 between the station 5 and the first and second transfer robots 3, 4. The stockers 2, the station 5 and the first to third transfer robots 3, 4 and 7 are controlled by a control unit 8 in a coordinated manner, which will be described in more detail later on.

Figure 4:
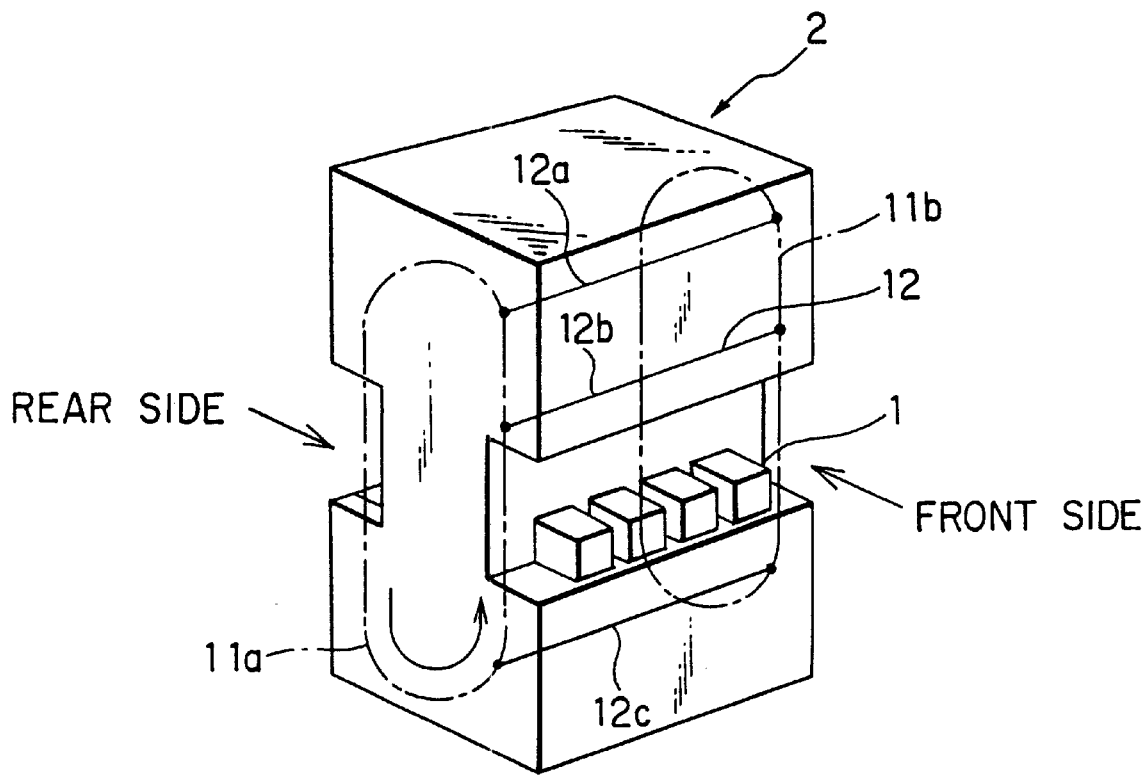
FIG. 4 is a perspective view showing schematically and representatively one of the stockers constituting a stocker array.
Figure 5:
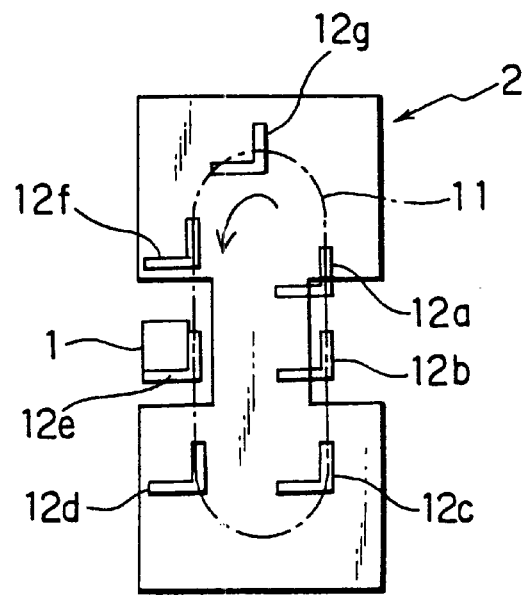
FIG. 5 is a side elevational view of the same.

FIG. 4 is a perspective view showing schematically and representatively a structure of one of the stockers or compartments, and FIG. 5 is a schematic side elevational view of the same. Referring to FIGS. 4 and 5, each of the stockers (compartments) 2 includes a pair of endless conveyor chains 11a and 11b mounted to be movable along respective closed loops in upward and downward directions in synchronism with each other and a plurality of shelves 12a, . . . , 12g mounted in horizontal disposition between the pair of conveyor chains 11a and 11b with a predetermined distance between the shelves. The chain conveyors 11a and 11b are driven by a suitable motor means (not shown) under a command issued from the control unit 8 so that the individual shelves 12a, . . . , 12g move along a substantially elliptical path defined by the chain conveyors 11a and 11b while maintaining the horizontal disposition. In this manner, a desired one of the shelves 12a, . . . , 12g can be moved under the command of the control unit 8 to appropriate positions for transferring the lot(s) 1 with the first or second transfer robot 3 or 4. At this juncture, it should be mentioned that each of the shelves 12a, . . . , 12g are designed to receive and stock thereon a predetermined number of lots 1 (e.g. four lots as in the case of the illustrated embodiment). Further, it is assumed, only by way of example, that each of the lots 1 is comprised of a wafer cassette which in turn accommodates therein a predetermined number of semiconductor wafers.

The first transfer robot 3 is adapted to move along a rail 9 installed at a front side of the stocker array 20 while the second transfer robot 4 is movable along a rail 10 installed at a rear side of the stocker array 20, both robots 3 and 4 moving reciprocatively between the stockers 2 and the station 5 also under the command of the control unit 8.

The lot identifying device 6 may be implemented in the form of, for example, a bar code reader for reading an identification number affixed to each of the lots 1 in the form of a bar code, wherein the lot identification number as read by the bar code reader 6 is sent to the control unit 8.

Figure 6:
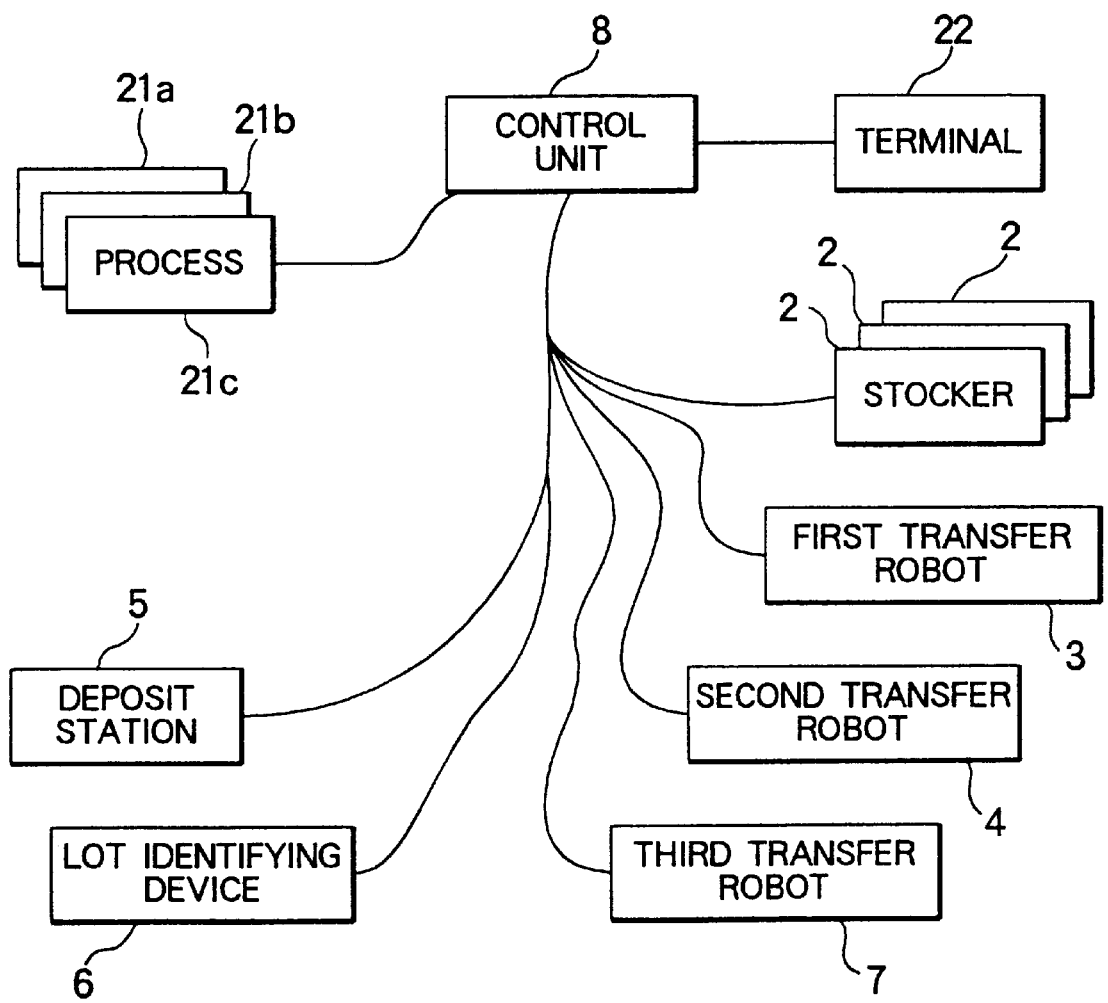
FIG. 6 is a diagram for schematically illustrating a configuration of the automatic lot organization apparatus according to the first embodiment of the invention.

FIG. 6 is a diagram for illustrating generally a system configuration of the automatic lot organization apparatus now under consideration. As can be seen from this figure, the control unit 8 which may be constituted by a computer or the like is connected to a variety of treatment units 21a, 21b, 21c, etc. incorporated in a manufacturing line, the station 5, the lot identifying device (or bar code reader) 6, the first to third transfer robots 3, 4 and 7, the stockers 2 and a terminal unit 22, wherein the control unit 8 is in charge of managing and controlling operations of the above-mentioned various constituents in accordance with instructions including the conditions for lot organization as inputted through the terminal unit 22.

In general, in a semiconductor device manufacturing line in which a plurality of lots 1 are organized or grouped into a set to undergo a series of processings or treatment on a batch basis (i.e., batch-by-batch processing or treating), there may arise such situation in which the number of lots belonging to one set differs from one to another process. Suppose, for example, a manufacturing line in which one lot is treated in one process, which is then followed by another process where four lots are simultaneously treated. In that case, it is necessary to rearrange or organize the set of lots between these processes. The present invention teaches that a process or step dedicated for organizing (i.e., rearranging or regrouping) the lots without treating them in the intrinsic sense is provided between the processes which differ from each other in respect to the number of lots undergoing treatments on a batch basis, for thereby organizing (rearranging or regrouping) the lots in the set (batch) in dependence on the conditions for treatment in a succeeding process as well as load of the manufacturing line, priority levels of treatings and/or other conditions, as occasion requires.

Figure 7:
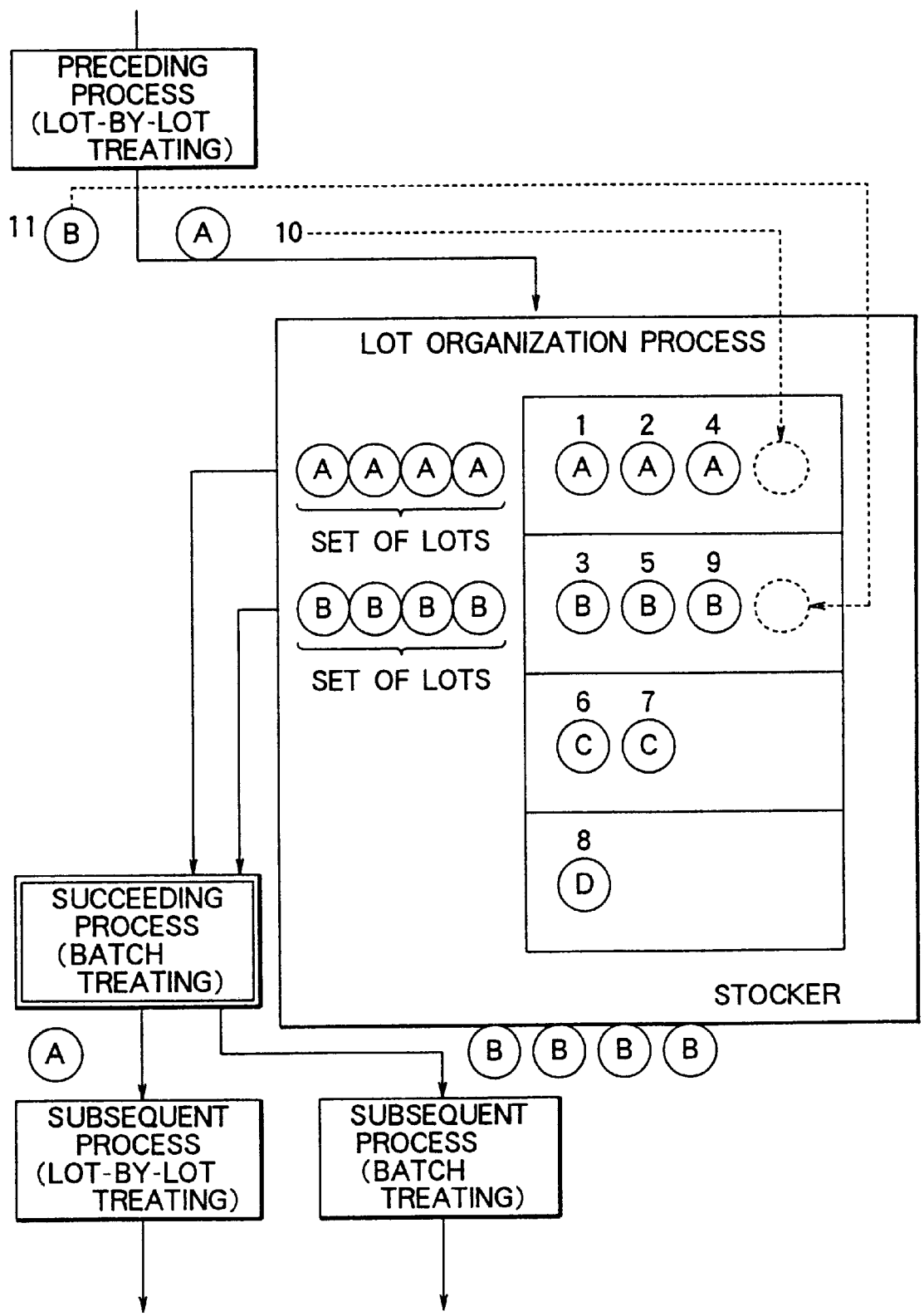
FIG. 7 is a flow chart for illustrating a semiconductor wafer manufacturing line incorporating an automatic lot organization apparatus according to the present invention.

FIG. 7 is a diagram for illustrating, only by way of example, operation in a semiconductor wafer manufacturing line incorporating an automatic lot organization apparatus according to the present invention. In this figure, symbols A to D represent lots which are to undergo treatments under identical conditions, respectively, while numerals indicate the order in which the lots arrived at the lot organization stage from the proceed process.

In the automatic lot organization apparatus of the structure described above, the control unit 8 receives the lot identification (ID) information from the lot identifying device 6 to control the stocker array and the transfer robots on the basis of the lot identification information coordinatively such that those of the lots stored in the stockers which are decided to undergo a identical treatment on a batch-by-batch basis in the succeeding process are organized into a set. In that case, the first and second transfer robots 3 and 4 may be controlled by the control unit 8 on the basis of the lot identification information, stocker position information and the conditions for the treatment which the lots are to. The control may be perfamed such a manner that those of the lots disposed on the station 5 which are decided to undergo identical treatment in the succeeding process on a batch-by-batch basis are once placed in a same compartment or stocker of the stocker array and taken out from the compartment (stocker) to be transferred to the succeeding process as a set of lots to be treated on a batch-by-batch basis in the succeeding process. On the other hand, the third transfer robot 7 receives the lots delivered from the preceding process to dispose them on the deposit station 5 at a position where lot identification information of the lots can be read out by the lot identifying device 6, wherein the third transfer robot 7 can additionally be used for transferring the lots between the deposit station 5 and the first transfer robot 3 as well as between the second transfer robot 4 and the deposit station 5 under the control of the control unit.

Figure 8:
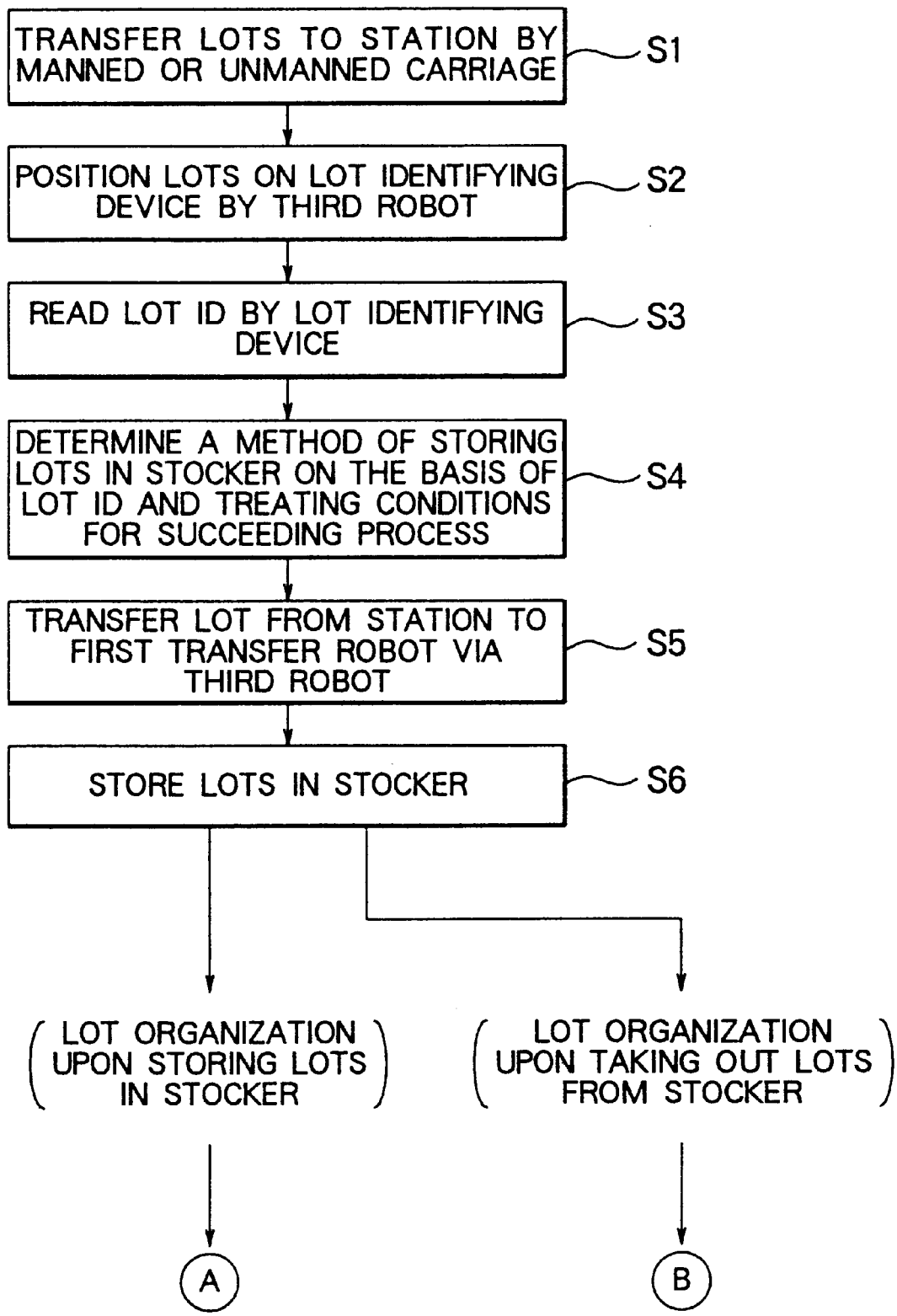
FIGS. 8 and 9 are flow charts for illustrating an automatic lot organization method according to a second embodiment of the present invention.
Figure 9:
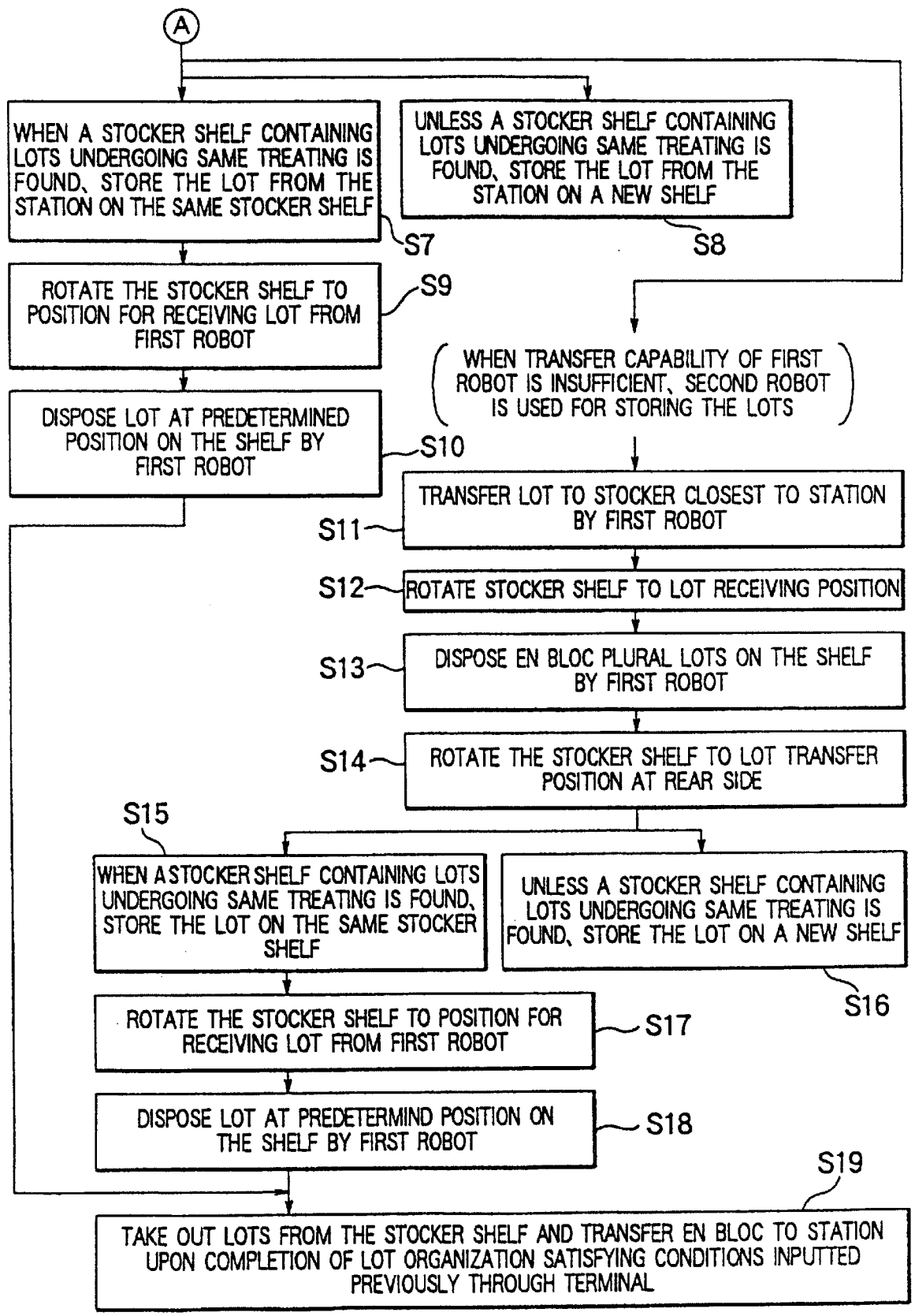
Figure 10:
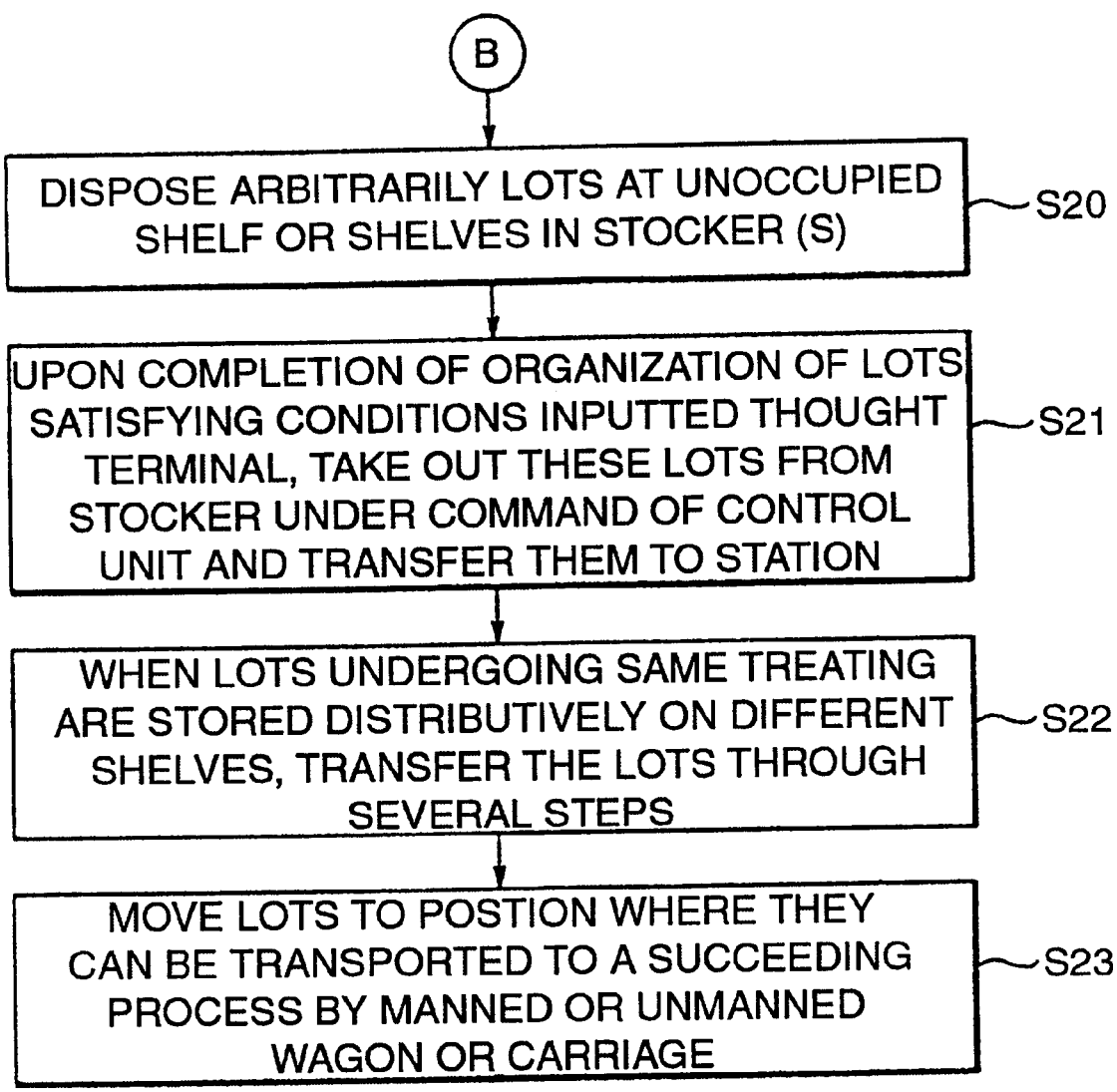
FIG. 10 is a flow chart for illustrating in combination with FIG. 8 an automatic lot organization method according to a third embodiment of the invention.
Figure 11:
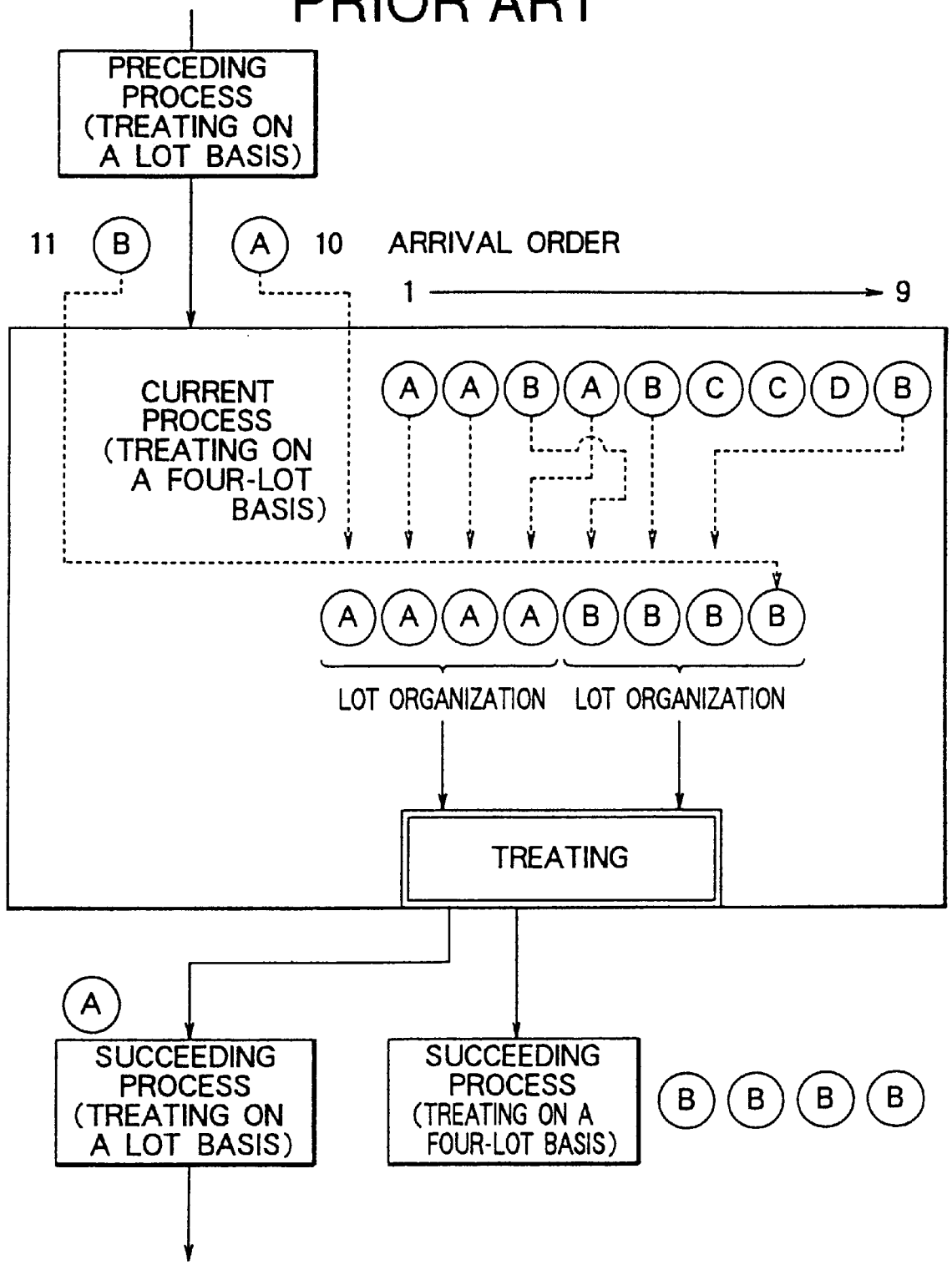
FIG. 11 is a schematic diagram illustrating a hitherto known semiconductor wafer manufacturing process.

Next, referring to FIGS. 8 to 10, automatic lot organization methods will be elucidated in more detail.

Embodiment 2

Now, referring to FIGS. 7 to 9, description will be made of an automatic lot organization method in conjunction with a semiconductor device manufacturing line according to a second embodiment of the invention.

Referring to FIG. 7, lots 1 transported from a preceding process stage (where the lots are treated one by one) to the station 5 of the automatic lot organization apparatus by means of a manned or unmanned carriage or wagon (not shown), as indicated by broken lines, are first placed on the station 5 in a step S1 (FIG. 8), whereupon the lots are transferred by the third transfer robot 7 to a position on the station 5 at which the lots are identified by the lot identifying device 6 (step S2).

The lot identifying device 6 reads the identification (ID) numbers of the individual lots 1 and sends the ID information to the control unit 8 in a step S3. The control unit 8 then determines storage of the lots in the stockers 2 by referencing the lot organization conditions inputted through the terminal unit 22 as well as the lot information stored previously in a memory incorporated in the control unit 8, whereupon commands are issued for operations of the first, second and/or third transfer robots 3, 4, 7 in a step S4.

In a step S5, the lot 1 allocated with the lot ID number as identified is moved by the third transfer robot 7 to the position for transfer to the first or second robot 3 or 4.

Subsequently, the lot is stored in one of the shelves 12 of a particular one of the stocker 2 by the first transfer robot 3 under the command of the control unit 8 in a step S6. It should be mentioned that the lot organization may be carried out at the time when the lot is stored in the stocker 2 or when the lot is taken out from the stocker 2. The second embodiment is directed to the organization of the lots upon storage thereof in the stocker or compartment 2.

More specifically, referring to FIG. 9, when it is decided by the control unit 8 that some lots 1 which are to undergo identical treatment (e.g. same type of diffusion or heat treating at a same temperature for a same period under a same gas atmosphere or the like) have already been stored at a shelf or shelves in one of the stockers 2, the first transfer robot 3 receiving a next lot 1 from the station 5 via the third robot 7 transfers it to the specific stocker (compartment) 2 including the shelf 12 having accommodated thereon the lots 1 which are to undergo the same treating (step S7). On the other hand, when the stocker 2 storing the lots to undergo treatment under the same conditions is found, the lot received from the station 5 is stored in an arbitrarily selected one of the stockers 2 in a step S8. In that case, the shelf 12 of the stocker 2 storing the lots 1 to be treated under the same conditions or an empty shelf of a given one of the stockers 2 is revolved to the position for receiving the lot from the first transfer robot 3 in a step S9, whereby the lot 1 is stored at a predetermined position of the shelf 12 by the first transport robot 3 (step S10). The operation described above is repeated for each lot (four times in the case of the illustrated example) to realize the lot organization.

When the transfer or handling capability is insufficient with only the first transfer robot 3, the storage of the lots in the stocker 2 can be performed by using the second transfer robot 4 as well. In that case, the lots 1 should preferably be transported to a stocker 2a located closest to the station 5 in a step S11 by the first transfer robot, as shown in FIG. 3, and an empty one of the shelves 12 of that stocker 2a is moved to the position for receiving the lot from the first transfer robot 3 in a step S12. In this manner, a predetermined number of lots 1 are disposed in a group or en bloc on the empty shelf 12 by the first transfer robot 3 in a step S13 and thereafter the shelf 12 is moved to the position for transferring the lots to the second transfer robot 4 in a step S14 by driving the chain conveyors 11 under the command of the control unit 8. Subsequently, the lots 1 are transported by the second transfer robot 4 to the stocker 2 accommodating therein the lots which are to undergo identical treatment in a step S15.

Unless no stocker is available for accommodating the lots to be treated under same conditions, the lots 1 transported by the second transfer robot 4 are stored in an empty stocker 2 (step S16). Thereafter, through operations similar to those in the steps S9 and S10, the lots 1 are disposed at predetermined positions on the shelf 12 supporting thereon the lots to be treated under the same conditions or at predetermined positions on the empty shelf 12 (steps S17 and S18).

At the time point when the lot organization or grouping has been completed under the conditions inputted previously into the control unit 8 through the terminal unit 22, a predetermined number of lots 1 are taken out from a predetermined one of the shelves 12 by means of the first transfer robot 3 to be transported to the station 5 (step S19).

Embodiment 3

Next, description will be made of the lot organization method performed when the lots 1 are taken out from the stocker(s) 2 in accordance with a third embodiment of the invention. At first, upon storage of the lots 1 from the station 5, the lots are disposed at an unoccupied position of a given shelf 12 in a given one of the stockers 2 (step S20). In that case, the stocker 2 is so selected that the load imposed on the first and second transfer robots 3 and 4 required for storing the lots can be minimized. More specifically, when a plurality of lots 1 are handled en bloc, they are stored, if possible, on one empty shelf 12 of one stocker 2 without being distributed onto a plurality of shelves 12.

Upon completion of the lots in the stocker 2 from the station 5, a predetermined number of lots 1 (four lots in the case of the illustrated embodiment) are taken out from the shelf or shelves 12 of the stocker 2 accommodating therein the lots 1 which satisfy the lot organization conditions inputted through the terminal unit 22 and carried to the station 5 (step S21). In the case where the lots 1 of concern are stored distributively on a plurality of shelves 12, the lots 1 to undergo identical treatment are taken out from the corresponding shelves 2 to be transported to the station 5 through a corresponding number of times of operations to thereby organize a group or set which includes a predetermined number of lots (step S22). The predetermined number of lots 1 transported onto the station 5 are moved to a position where the lots 1 can be transported to a succeeding process by an unmanned or manned wagon or carriage in a step S23.

The conditions for lot organizations may previously be registered in the control unit 8 so that the conditions can be modified as desired with the aid of the terminal unit 22.

Many features and advantages of the present invention are apparent form the detailed specification and thus it is intended by the appended claims to cover all such features and advantages of the apparatus which fall within the true spirit and scope of the invention. Further, since numerous modifications and combinations will readily occur to those skilled in the art, it is not intended to limit the invention to the exact construction and operation illustrated and described.

By way of example, the foregoing description of the illustrated embodiments of the invention has been made on the assumption that the lots are treated on a lot-by-lot basis in the process preceding the lot organization of the invention while in the succeeding process the lots are treated in a batch including four lots. It should however be understood that the invention is not restricted to such organization. In general, the invention can find application to lot organization from a given number (N) of lots to another given number (M) of lots where N may be smaller or greater than M. Further, in a semiconductor device manufacturing line, several sorts of processes such as wetting of semiconductor wafer, photolithography, ion implantation, etching and so forth are carried out repeatedly. Accordingly, there may arise a case where a plurality of treatings have to be assigned to a single process. In that case, load (represented by a number of lots) imposed on that process increases considerably over the other processes, which results in a corresponding increase in the resident time of the lot in the manufacturing line. To solve this problem, the lot organization process taught by the invention should preferably be provided in precedence to the process in which a large number of treatings are concentrated so that the lots to undergo the above process are allotted with a higher priority by manipulating correspondingly the data inputted to the terminal unit 22, to thereby unite the times taken for the lots to be treated throughout all the processes.

Additionally, it is important to note that although the invention has been described in conjunction with manufacturing of semiconductor devices, the invention is not restricted thereto but can find many other applications where articles in the broadest sense are manufactured through a series of processes under conditions similar to those described above.

Further, the stocker array may be implemented in the form of a cylindrical structure having a plurality of stockers or compartments arrayed along a circle so that the stocker array can be rotated to predetermined positions for lot transfer with the first and second robots to thereby mitigate the burden to be borne by the robots.

Accordingly, all suitable modifications and equivalents may be resorted to, falling within the spirit and scope of the invention.

We claim:

1. In a semiconductor device manufacturing line which includes a plurality of processes for treating a plurality of lots en bloc on a batch-by-batch basis, each lot comprising a wafer cassette including a plurality of semiconductor wafers, a method of automatically organizing said lots, comprising the steps of:

electronically reading grouping conditions associated with a lot for storing the lot in one of a plurality of stockers, each stocker including a plurality of shelves for storing a plurality of lots, the grouping conditions including treatments to be applied to the lot and priorities of the treatments to be applied to the lot;

electronically determining lot organization conditions of the plurality of stockers, the lot organization conditions including the grouping conditions of lots stored in each stocker;

electronically determining a shelf in one of the plurality of stockers for storing the lot based on the grouping conditions of the lot and the lot organization conditions of the stockers; and actuating at least one transfer robot to transfer the lot to the shelf.

2. The method according to claim 1, wherein electronically determining the shelf in one of the stockers for storing the lot comprises locating a shelf including lots scheduled to undergo treatments identical to the treatments specified in the grouping conditions of the lot to be stored.

3. The method according to claim 1 further comprising:

storing a plurality of lots on a stocker before electronically determining lot organization conditions; and removing lots which are to undergo treatment under identical conditions from the stocker to be grouped in a batch.

4. The method of claim 1, wherein electronically reading grouping conditions of the lot comprises reading a bar code associated with the lot.

5. The method of claim 1, wherein electronically determining lot organization conditions includes:

reading lot organization conditions input to a control unit through a terminal unit; and reading previously stored lot organization conditions of the plurality of stockers from a memory of the control unit.

6. The method of claim 1, wherein actuating at least one transfer robot includes actuating a first transfer robot to move the lot from a receiving station to a second transfer robot and actuating the second transfer robot to transfer the lot to the shelf.

* * * * *